(12) United States Patent
Ouvrier-Buffet et al.

(10) Patent No.: US 7,652,242 B2
(45) Date of Patent: Jan. 26, 2010

(54) DEVICE FOR PROCESSING AND DIGITIZING AN ENERGY SPECTRUM OF AN ELECTROMAGNETIC RADIATION

(75) Inventors: Patrice Ouvrier-Buffet, Saint-Jorioz (FR); Ken-Ji De La Rosa, Lardier et Valenca (FR)

(73) Assignee: Commissariat A l'Energie Atomique, Paris (FR)

( * ) Notice: Subject to any disclaimer, the term of this patent is extended or adjusted under 35 U.S.C. 154(b) by 0 days.

(21) Appl. No.: 12/260,289

(22) Filed: Oct. 29, 2008

(65) Prior Publication Data

US 2009/0152448 A1 Jun. 18, 2009

(30) Foreign Application Priority Data

Dec. 13, 2007 (FR) .................................. 07 59816

(51) Int. Cl.
*H01J 40/14* (2006.01)
(52) U.S. Cl. ................... 250/214 R; 250/306; 324/522; 330/308
(58) Field of Classification Search ............. 250/214 R, 250/306; 324/522; 330/308
See application file for complete search history.

(56) References Cited

U.S. PATENT DOCUMENTS

| 6,998,850 B2* | 2/2006 | Baumgartner ............... 324/522 |
| 2006/0012250 A1 | 1/2006 | Ouvrier-Buffet et al. |
| 2007/0069822 A1 | 3/2007 | Ouvrier-Buffet et al. |
| 2007/0158551 A1 | 7/2007 | Audebert et al. |

FOREIGN PATENT DOCUMENTS

| EP | 1 762 854 A2 | 3/2007 |
| FR | 2 847 676 A1 | 5/2004 |
| FR | 2 864 628 A1 | 7/2005 |

* cited by examiner

*Primary Examiner*—Seung C Sohn
(74) *Attorney, Agent, or Firm*—Burr & Brown

(57) ABSTRACT

This device for processing and digitizing an energy spectrum of a radiation, comprises a charge preamplification circuit of the integrating circuit type, suitable for being connected to a semiconductor detector; a lag line energy measurement circuit connected to the output of the preamplification circuit; and a sampler connected to the output of the energy measurement circuit. It further comprises a synchronization circuit a current pulse measurement circuit connected to the output of the preamplification circuit and calculating the difference between the output and a differential of the output of the preamplification circuit; and a discrimination circuit forming a binary signal according to the output of the pulse measurement circuit said logic signal controlling the sampling times of the sampler.

5 Claims, 5 Drawing Sheets $V = \frac{1}{C}\int i\,dt \; \frac{Q}{C}$ (Prior art)

$\Delta t = Tm$ $\Delta t > Tm$

US 7,652,242 B2

DEVICE FOR PROCESSING AND DIGITIZING AN ENERGY SPECTRUM OF AN ELECTROMAGNETIC RADIATION

FIELD OF THE INVENTION

The present invention relates to the field of the detection of ionizing radiation by means of a semiconductor detector operating at ambient temperature, and in particular the field of the processing of electric charges generated by the ionization of a semiconductor element following its bombardment by photons.

BACKGROUND OF THE INVENTION

Detectors based on semiconductors, for example like detectors with a photodiode or phototransistor matrix, allow the direct conversion of the incident radiation into an electrical signal, and have applications in several fields, such as medical imaging, luggage inspection and nuclear probes, for example.

A conventional spectrometer, that is a detector coupled with a processing and digitization circuit which determines the energy spectrum of the radiation received by the detector, is shown in FIG. 1 under the general reference 10. The spectrometer 10, designed for applications requiring a high counting rate of the incident photons on the detector, measures the energy of the photons using a lag line.

This spectrometer 10 comprises a semiconductor detector 12, for example made from CdZnTe, CdTe:Cl, or CdTe:In, polarized under a "HT" DC voltage via a resistance 14.

The detector 12 is subjected to a photon radiation, for example of gamma photons or X-ray photons, which ionize the semiconductor material. The charges thereby generated migrate toward electrodes (not shown) of the detector 12 due to the existence of the HT bias voltage.

The charge current "i" thus generated is recovered on a collector electrode 16 by a processing and digitization circuit 18, which counts the incident photons according to their energy in order to obtain the energy spectrum of the radiation.

The circuit 16 comprises a low noise charge preamplifier 20 mounted as an integrated circuit, a lag line energy measurement circuit 22, and an analog-to-digital converter 24.

The preamplifier 20 comprises a high gain amplifier 26 mounted in negative feedback with a parallel mounting of a capacitance 28, having the value $C_1$, and a resistance 30, having the value $R_1$, and also a capacitance 32 connected between the collector electrode 16 and the input of the amplifier 26.

FIG. 2 shows two pulses $I_1$ and $I_2$ of the current i resulting from the interaction of two photons with the detector 12, and FIG. 3 shows the corresponding voltage $V_{out}$ at the output of the preamplifier 20.

The energy measurement circuit 22 comprises a lag line 32, connected to the output of the preamplifier 20 and applying thereto a predefined lag $\Delta t$ and a first gain 34, connected to the output of the line 32.

The energy measurement circuit 22 also comprises a subtractor 36, connected to the preamplifier 20 and to the first gain 34 and calculating the difference between their outputs. Finally, a second gain 38 is provided at the output of the subtractor.

FIG. 4 shows, as a function of time "t", a voltage $V_{out}(t)$ at the output of the preamplifier 20, the corresponding lag voltage at the output of the first gain 34 $V_{out}(t-\Delta t)$, and the corresponding voltage E(t) at the output of the energy measurement circuit 22.

The energy measurement circuit 22 therefore generates voltage pulses corresponding to the charge pulses generated by the incident photon on the detector. It is demonstrated that the amplitude of a pulse at the output of the circuit 22 is proportional to the energy of the corresponding photon if and only if the lag $\Delta t$ is greater than the rise time $T_m$ of the voltage $V_{out}$ at the output of the preamplifier 20. FIGS. 5 to 10 show, as a function of time, the shape of a pulse E(t) at the output of the circuit 22 for $\Delta t = T_m$ (FIGS. 5 to 7) and for $\Delta t > T_m$ (FIGS. 8 to 10).

The output voltage of the measurement circuit 22 is therefore converted to a digital voltage by the converter 24, that is quantified and sampled in time at a predefined sampling frequency $f_e$.

The digital voltage is then delivered to a digital processing module (not shown) which detects the digital voltage peaks to determine the energy of the photons and thereby construct an energy spectrum of the incident radiation on the detector.

The abovementioned system permits a high counting rate (about a few megaphotons per second).

However, the charge sampling and generation in the detection are asynchronous events. Accordingly, some sampling times may be inappropriate because not corresponding to the voltage peaks at the output of the measurement circuit. This problem is particularly serious when the peaks of this voltage display very steep slopes. To reduce this drawback, it is possible to significantly increase the sampling frequency of the converter, but at the cost of very expensive equipment with high power consumption.

SUMMARY OF THE INVENTION

It is the object of the present invention to solve the above mentioned problem by proposing a processing and digitizing circuit that synchronizes the sampling with the production of current pulses in the detector.

For this purpose, the invention relates to a device for processing and digitizing an energy spectrum of a radiation, comprising:
  a charge preamplification circuit of the integrating circuit type, suitable for being connected to a semiconductor detector;
  a lag line energy measurement circuit connected to the output of the preamplification circuit; and
  a sampler connected to the output of the energy measurement circuit,
According to the invention, this device comprises a synchronization circuit comprising:
  a current pulse measurement circuit calculating the difference between the output and a differential of the output of the preamplification circuit; and
  a discrimination circuit forming a binary signal according to the output of the pulse measurement circuit, said logic signal controlling the sampling times of the sampler.

In other words, the synchronization circuit generates synchronous pulses with the current pulses at the collector electrode of the detector. This provides a sampling signal for the output of the energy measurement circuit so that it is unnecessary to use a converter with a very high sampling frequency.

According to particular embodiments of the invention, the system comprises one or more of the following features.

The synchronization circuits further comprises a smoothing circuit for eliminating the pulses of the logic signal, having a duration longer than a predefined threshold duration. In particular, the predefined threshold duration is shorter than or equal to the rise time of the charge preamplification circuit.

In other words, the counting and measurement of the charges generated by the incident photons on the detector substantially simultaneously are eliminated. It is in fact well known that such charge stacks distort the energy spectrum of the radiation when they are taken into account.

The integration time constant of the preamplification circuit is substantially equal to the differentiation time constant of the pulse measurement circuit.

Thus, the pulses generated at the output of the pulse measurement circuit are substantially proportional to the current pulses at the detector output, thereby increasing the accuracy of synchronization.

The pulse measurement circuit comprises:

a differentiator stage comprising a high gain amplifier, a capacitance connected to the input of the high gain preamplifier, and a resistance connected between the input and the output of the high gain preamplifier; and a subtractor stage connected to the outputs of the preamplification circuit and the differentiator stage.

BRIEF DESCRIPTION OF THE FIGURES

The invention will be better understood from a reading of the following description, provided exclusively as an example, and in conjunction with the appended drawings, in which identical reference numerals denote identical or similar elements, and in which.

DETAILED DESCRIPTION OF THE INVENTION

Figure 1:
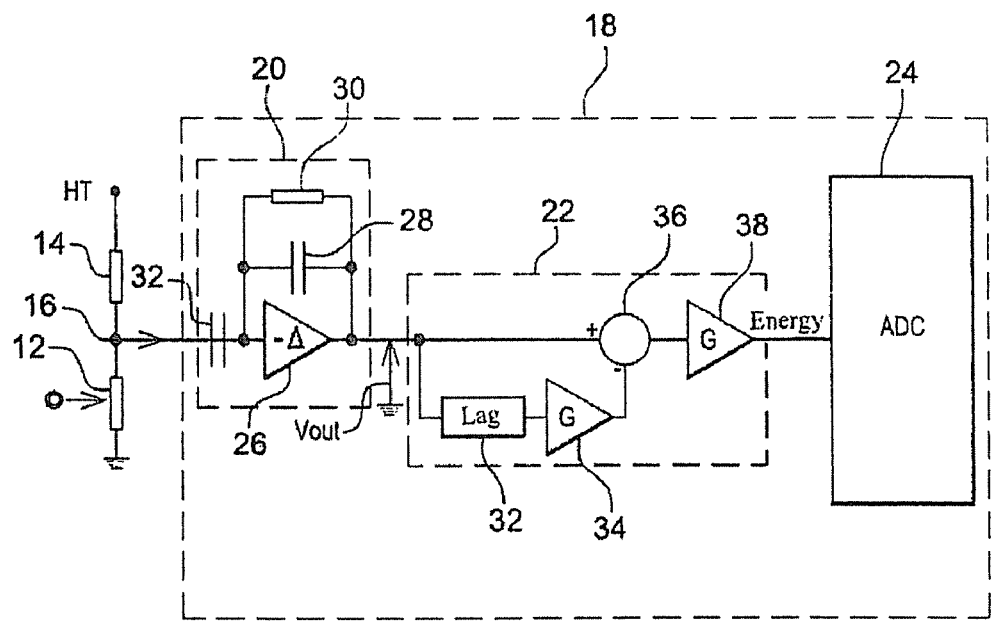
FIG. 1 is a schematic view of a spectrometer of the prior art, discussed in relation to the preamble.
Figure 2:
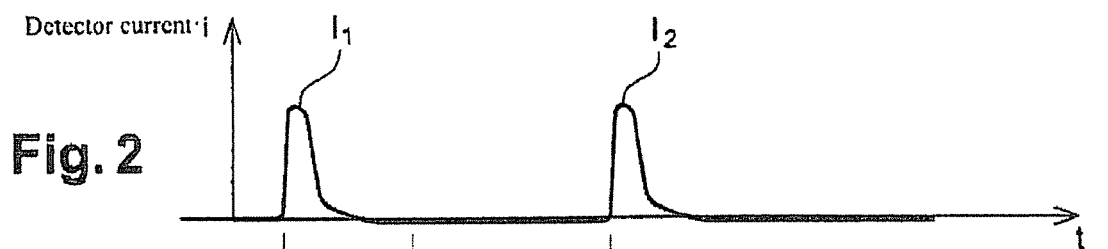
FIGS. 2 to 10 are curves of signals resulting from the use of the spectrometer in FIG. 1.
Figure 3:
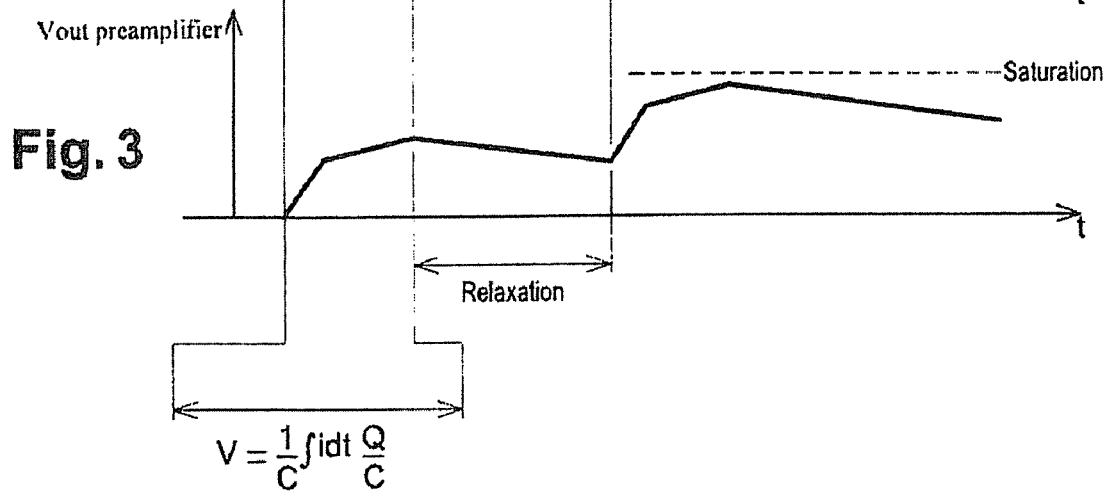
Figure 4:
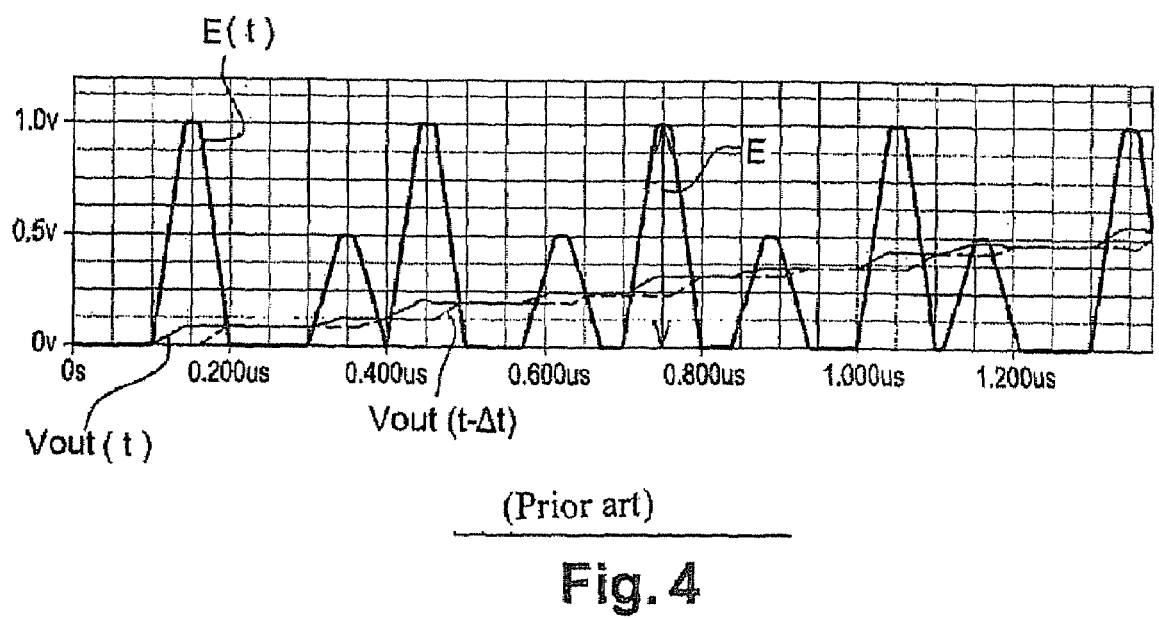
Figure 5:
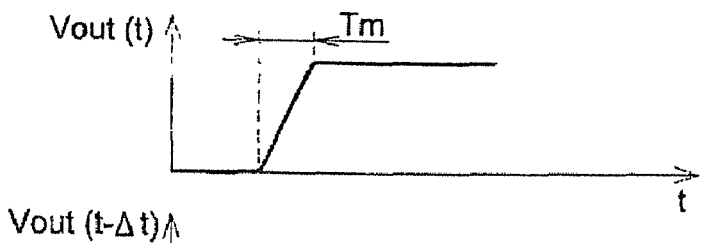
Figure 6:
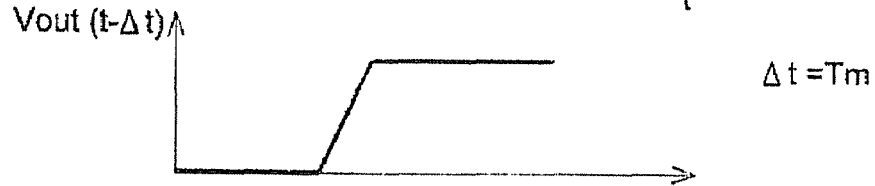
Figure 7:
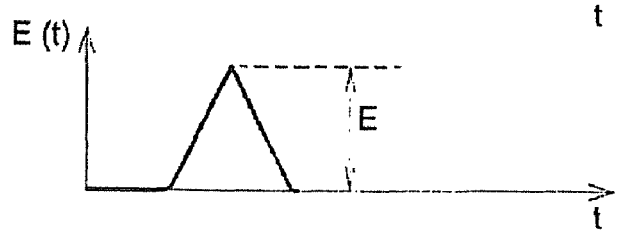
Figure 8:
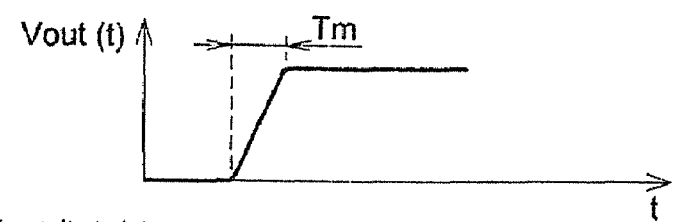
Figure 9:
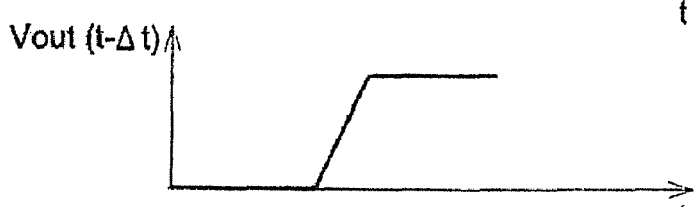
Figure 10:
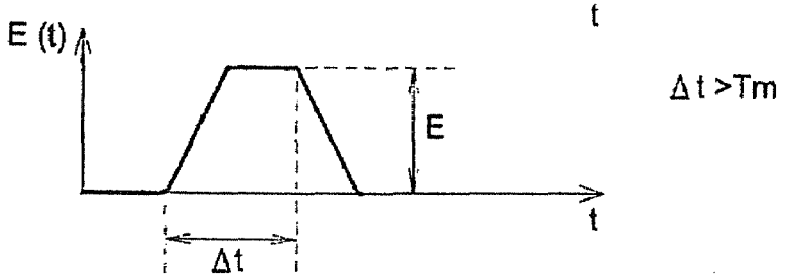
Figure 11:
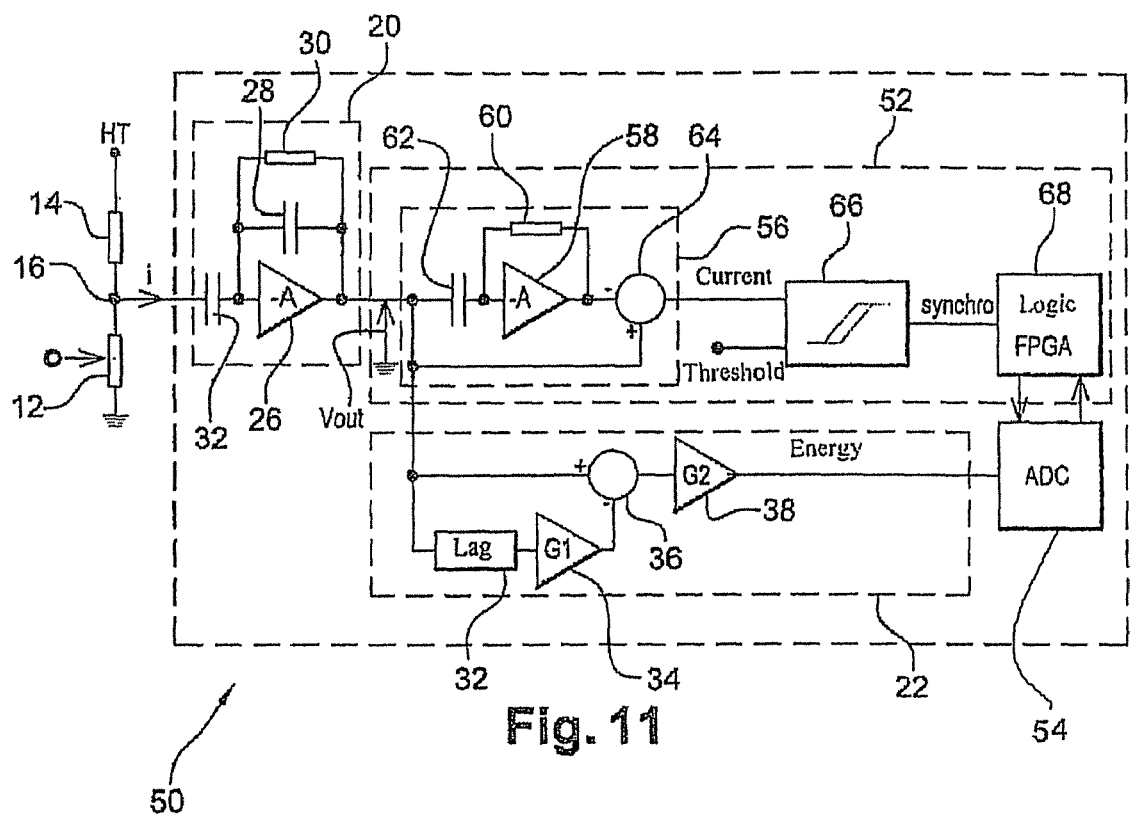
FIG. 11 is a spectrometer according to the invention.

In FIG. 11, the detector 12 is associated with a processing and digitizing circuit 50 according to the invention.

In addition to the preamplifier 20 and the energy measurement circuit 22, the circuit 50 comprises a synchronization circuit 52 and an analog-to-digital converter 54 controlled by the synchronization circuit 52.

The synchronization circuit 52 comprises a pulse measurement circuit 56 comprising a high gain amplifier 58 mounted in negative feedback with a resistance 60, having the value $R_2$ and a capacitance 62, having the value $C_2$, connected between the input of the amplifier 58 and the output of the preamplifier 20. The pulse measurement circuit 56 also comprises a subtractor 64, connected to the output of the preamplifier 20 and of the amplifier 58 and calculating the difference between them.

The pulse measurement circuit 56 therefore calculates the difference between the output of the preamplifier 20 and a differential thereof determined by the elements 58, 60 and 62.

Preferably, the differentiation time constants calculated by the elements 58, 60 and 62, and of the integration, carried out by the preamplifier 20, are substantially equal, that is satisfying the equation $R_2C_2=R_1C_1$. In this way, the output of the subtractor 64 is substantially proportional to the current i at the collector electrode 16.

For further details on the operation and the advantages procured by such a pulse measurement circuit, reference can be made to document EP 1 762 854.

The synchronization circuit also comprises a threshold discrimination circuit 66 connected to the output of the subtractor 64. The circuit 66 saturates the output of the pulse measurement circuit 56 to a first value when the latter is more than a predefined threshold, and if not, saturates the output of the circuit 66 at a second value, for example 0. This produces, at the output of the discrimination circuit 66, a binary signal formed of pulses which are synchronous with the pulses of the current i at the collector electrode 16.

Preferably, the synchronization circuit 62 comprises a logic circuit 68 using a filter that eliminates the pulses having a duration longer than a predefined value $T_{mc}$. The value $T_{mc}$ is selected as substantially equal to the rise time of the preamplifier 22 which corresponds to the width of the current pulse produced by the interaction of a single photon in the detector 12. This width depends on the characteristics of the detector 12 and on the HT bias voltage thereof. In this way, the pulses actually corresponding to a charge stack in the detector produced by the virtually simultaneous bombardment thereof by several photons, are eliminated without the need to use complex algorithms.

The analog-to-digital converter 54 digitizes the output of the pulse measurement circuit 22 by using the pulses of the synchronization circuit 52. The start of the digitization is initialized on the pulse edge of the synchronization circuit 52 and, by introducing an adjustable lag, it is possible to accurately synchronize the time of digitization with the voltage peaks at the output of the measurement circuit 22.

Figure 12:
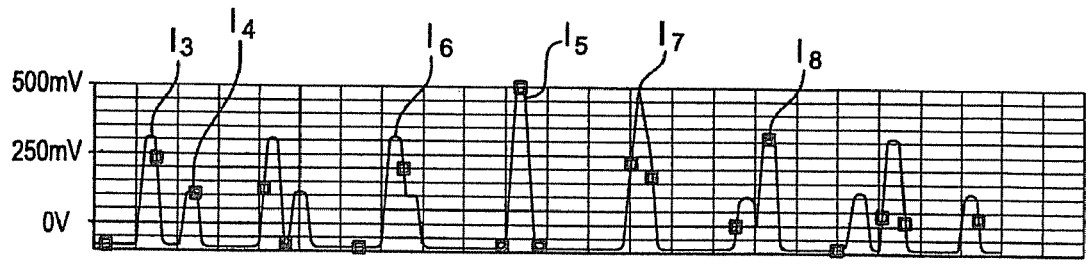
FIGS. 12, 13 and 14 are curves of signals resulting from the use of the spectrometer in FIG. 5.

FIG. 12 shows an example of a current i collected at the output of the detector 14. It shows the pulses generated by a single photon, like for example the pulses $I_3$, $I_4$, $I_5$, and the pulses generated by two photons, like for example the pulses $I_6$, $I_7$ and $I_8$.

Figure 13:
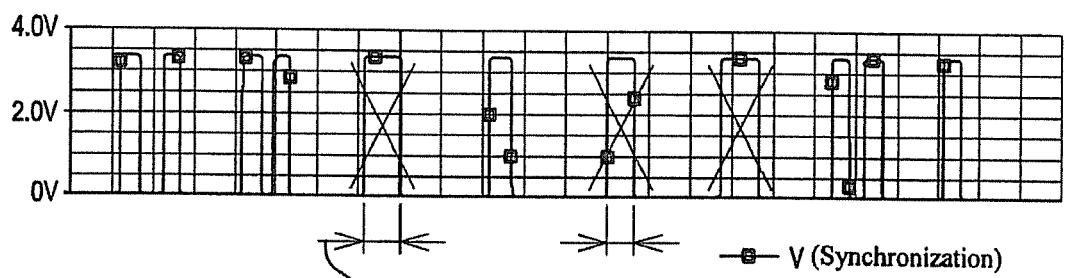

FIG. 13, shows a plot of the corresponding binary voltage at the output of the synchronization circuit 52 without the elimination of the pulses $I_6$, $I_7$ and $I_8$ generated by several photons and with the elimination of these pulses (pulses marked by an X).

Figure 14:
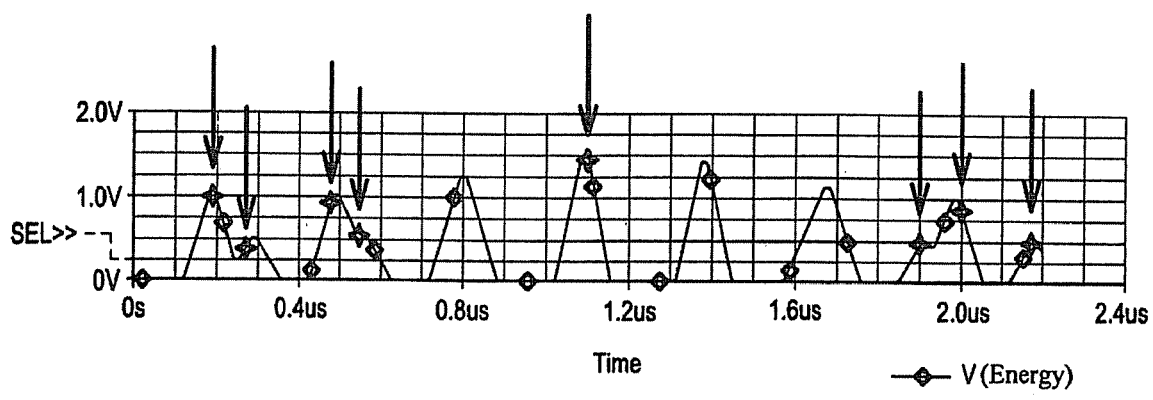

FIG. 14 shows a plot of the output voltage of the energy measurement circuit 22 on which the times of digitization by the converter 54 are identified by stars.

The invention procures the following advantages:

a synchronization of the digitization to the generation of the current pulses in the detector;

a high counting rate, higher than 10 megaphotons per second, becomes possible. In fact, the pulse energy is measured with a dead time close to the charge transit time in the detector; and a simple and effective elimination of the pulses produced by a charge stack.

The invention claimed is:

1. A device for processing and digitizing an energy spectrum of a radiation, comprising:

a charge preamplification circuit of the integrating circuit type, suitable for being connected to a semiconductor detector and delivering a preamplified signal at an output;

a lag line energy measurement circuit connected to the output of the preamplification circuit; and a sampler connected to the output of the energy measurement circuit, wherein it further comprises a synchronization circuits comprising:

a current pulse measurement circuit connected to the output of the preamplification circuit and calculating the difference between the output of the preamplification circuit and a differential of the output of the preamplification circuit; and a discrimination circuit forming a binary logic signal according to the output of the pulse measurement circuit, said logic signal controlling the sampling times of the sampler.

2. The device as claimed in claim 1, wherein the synchronization circuits further comprises a smoothing circuit for eliminating the pulses of the logic signal, having a duration longer than a predefined threshold duration.

3. The device as claimed in claim 2, wherein the predefined threshold duration is shorter than or equal to the rise time of the charge preamplification circuit.

4. The device as claimed in claim 1, wherein the integration time constant of the preamplification circuit is substantially equal to the differentiation time constant of the pulse measurement circuit.

5. The device as claimed in claim 1, wherein the pulse measurement circuit comprises:

a differentiator stage comprising a high gain amplifier, a capacitance connected to the input of said high gain preamplifier, and a resistance connected between the input and the output of the high gain preamplifier; and a subtractor stage connected to the outputs of the preamplification circuit and the differentiator stage.

\* \* \* \* \*